(12) United States Patent
Chen et al.

(10) Patent No.: US 6,386,456 B1
(45) Date of Patent: May 14, 2002

(54) MEMORY CARD IDENTIFICATION SYSTEM

(75) Inventors: Chin-Long Chen, Fishkill; Charles D. Holtz, Catskill; Giacomo V. Ingenio; William W. Shen, both of Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/326,233

(22) Filed: Jun. 4, 1999

(51) Int. Cl.[7] .............................................. G06K 19/00
(52) U.S. Cl. ...................... 235/487; 235/375; 235/492
(58) Field of Search ................................ 235/487, 492, 235/375, 380, 382; 714/39; 438/600

(56) References Cited

U.S. PATENT DOCUMENTS

| | | | |
|---|---|---|---|
| 5,253,208 A | | 10/1993 | Kang |
| 5,714,416 A | * | 2/1998 | Eichman et al. ............. 438/600 |
| 5,760,478 A | * | 6/1998 | Bozso et al. ................. 257/777 |
| 5,812,470 A | | 9/1998 | Ochoa et al. |
| 5,913,020 A | | 6/1999 | Rohwer |
| 6,128,746 A | * | 10/2000 | Clark et al. .................. 713/324 |
| 6,292,908 B1 | * | 9/2001 | Arimilli et al. ............... 714/39 |

* cited by examiner

Primary Examiner—Karl D. Frech
(74) Attorney, Agent, or Firm—Lynn Augspurger; Cantor Colburn LLP

(57) ABSTRACT

In a memory card, identification numbers identifying the memory card are permanently stored in fuse blown registers formed in each of two redrive chips, which function to read out data from memory chips of the memory card and store data in the memory chips of the memory card. Each identification number separately provides a unique identification of the memory card. The identification numbers are each stored with an error correction code by which single bit errors en the identification numbers can be corrected and the occurrence of multiple bit errors in the identification numbers can be detected. Both identification numbers, if valid, are used to identify the memory card and both of the identification numbers, if valid, are stored in association with memory quality events occurring on the memory card, so as to provide a redundant identification of the memory card on which the memory quality events occurred.

14 Claims, 2 Drawing Sheets

MEMORY CARD IDENTIFICATION SYSTEM

FIELD OF THE INVENTION

This invention relates to an improved system of identifying memory cards used as components of semiconductor chip memory arrays which make up the computer RAM.

TRADEMARKS

S/390 and IBM are registered trademarks of International Business Machines Corporation, Armonk, N. Y., U.S.A. and Lutus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

In computers, there is a need to be able to fetch a unique identification of each memory card used in the computer RAMs so that when a memory related event occurs on a memory card, a log of the memory related event can be kept in correlation with the specific memory card on which the error related event occurred. Examples of memory related events which need to be logged are the occurrences of correctable errors, uncorrectable errors, sparing events, store key errors and chip error log. Correctable errors are errors which can be corrected by the error correcton code forming part of each stored double word. Uncorrectable errors are errors which are detectable by the error correction code, but which cannot be corrected by the error correction code. A sparing event is a process in which a DRAM found to be defective is logically replaced on a memory card by a spare DRAM mounted on the memory card for that purpose.

Prior to the present invention, the identification of memory cards has been carried out by field engineers entering the card's serial numbers into the system console. This system of identification has not been completely satisfactory because the plug locations of memory cards are frequently swapped and memory cards are switched between computer systems in the process of identifying and isolating a failing memory card. This swapping process often results in the loss of traceability of the memory card hardware. The loss of traceability of memory card hardware is detrimental to quality control because once a serial number traceability is lost, it is impossible to precisely identify a specific memory card for replacement or recall due to quality problems. The resulting uncertainty regarding memory cards in which errors or other problems occur results in the recall or replacement of more hardware than would otherwise be required and in increased customer outages.

Modern memory cards have mounted thereon EPROMS which are capable of uniquely identifying and remotely identifying memory cards. However, the EPROM data on memory cards is intended to comprise vital physical data. It can be read or fetched through the universal power controller and cannot be read by the central processing unit addressing system which addresses and fetches data from selected locations in the RAM. As a result, the EPROM data is not directly available to be used in logging memory related events that occur on the memory card.

In addition, EPROMs are known to have a high failure rate. The data stored on the EPROM is used to dynamically configure the system storage during the time of the initial program loading. Because of the vulnerability of EPROMs to failure, EPROM data from multiple memory cards in the system are used to dynamically configure the system storage. When an EPROM failure occurs, if all the cards do not contain identical data, initial program loading failure could result. Accordingly, the storing or unique identifications in each EPROM would not be desirable.

SUMMARY OF THE INVENTION

In accordance with the invention, each memory card is provided with a unique identification called ECID. The ECID of each memory card is permanently stored on the re-drive chips of the memory card by being fuse blown in the memory chips. The re-drive chips are provided with the capability of fetching the ECID stored on the re-drive chips in response to a fetch command received from the central processing unit. In the preferred embodiment, there are two re-drive chips on each memory card and there is a unique ECID associated with each of the re-drive chips. Each ECID comprises 18 bits identifying the memory chip and six error correction code (ECC) bits by which errors in the ECID can be detected and, in the case of single bit errors, can be corrected. When it is desired to read the memory card identification, the ECID from both re-drive chips is read out and both ECIDs will uniquely identify the re-drive chip. The received bits of each ECID read from re-drive chips are examined by ECC decoding logic or algorithm. If a single bit error is indicated by the ECC decoding logic or algorithm, the single bit in error is corrected and the ECID as corrected is valid. Thus, valid data will be obtained from each ECID if they contain no errors or if they contain only single bit errors. If the EDD decoding logic or algorithm indicate that a multiple bit error exists in the ECID then the ECID is uncorrectable and is not valid. When the ECID is not valid, the ECID is not used as an identification of the chip and only the valid ECID from the other re-drive chip is used. If both chips have valid data, then either one of the ECIDs can be used as the identification of the memory card.

DESCRIPTION OF THE DRAWINGS

The foregoing and other objects, aspects and advantages will be better understood from the following detailed description of a preferred embodiment of the invention with reference to the drawings, wherein.

DETAILED DESCRIPTION OF THE INVENTION

Figure 1:
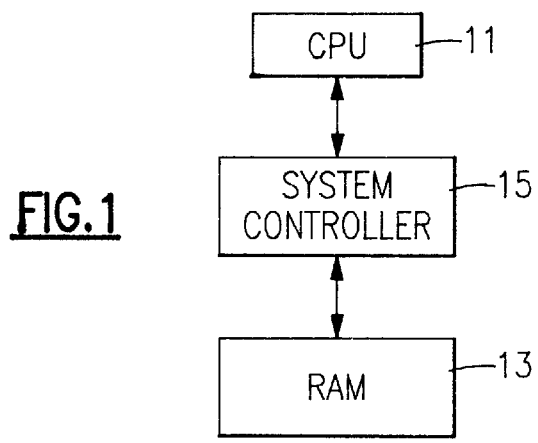
FIG. 1 is a block diagram illustrating a computer system in which the invention is used.
Figure 2:
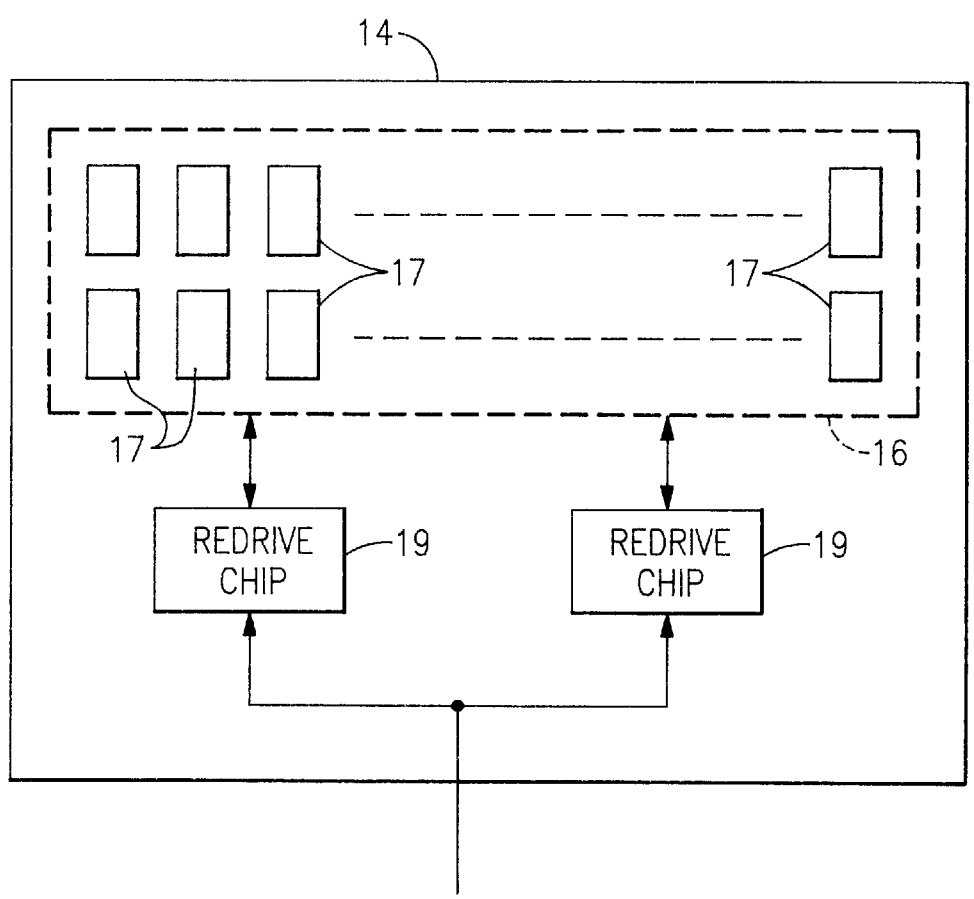
FIG. 2 schematically illustrates a memory card employed in the system in FIG. 1.

The computer system in which the present invention is employed, as shown in FIG. 1, comprises central processing unit 11 which controls a random access memory 13 by means of a system controller 15. The random access memory is made up of memory cards called PMA cards, one of which is schematically illustrated in FIG. 2. As shown in FIG. 2, the memory card is a circuit board 14 supporting an array 16 comprising rows of memory chips 17, such as DRAMs. The DRAMs define storage locations, which are addressable by two redrive chips 19, which are mounted on the circuit board 14. The redrive chips, in response to read or write commands received from the central processing unit 11 via the system controller 15 store data on or fetch data from the DRAMs. When the central processing unit seeks to read information from a selected storage location on the memory card, it transmits via the system controller 15 a fetch command and an address of the storage location to be read out to the redrive chips 19, which then read out the data from the selected location in the DRAMs 17. Similarly, when the central processing unit 11 stores data in the DRAMs of the memory card, it transmits via the system controller 15 a store command and an address of the storage location in which the data is to be stored to the redrive chips 19 along with the data to be stored, whereupon the redrive chips store the data in the storage location in the DRAMs selected by the address.

Figure 3:
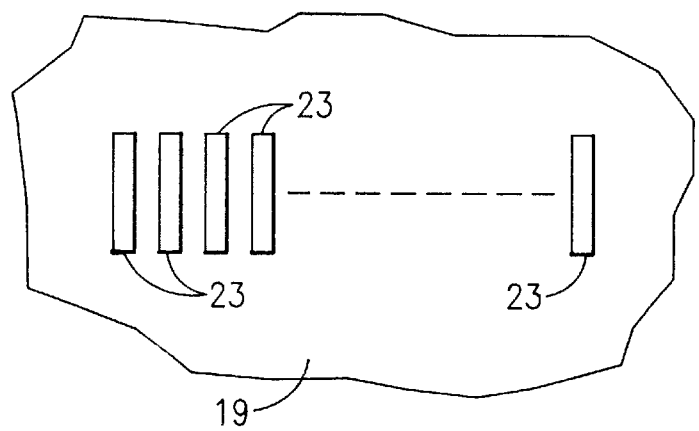
FIG. 3 schematically illustrates array fuses formed in a redrive chip to permanently store an ECID.

In accordance with the present invention, an ECID of the memory card is permanently stored on each of the redrive chips 19 in the form of blown fuses formed on or in the semiconductor material of the redrive chips. FIG. 3 is a plan view illustrating fuses formed in a redrive chip. As shown in FIG. 3, each redrive chip is provided with 24 fuses 23 comprising electrically conducting strips embedded in the chip. The fuses are preferably arranged in parallel and they may be comprised of metal or polysilicon. Each fuse will permanently store a binary digit. To store a binary one, the fuse is blown by having the electrically conducting strip of the fuse cut by a laser beam so as to interrupt the conducting path provided by the strip. To store a binary zero, the strip is left as is so that the conductive path from one end of the strip to the other is uninterrupted. The fuses 23 thus provide a 24 bit read only fuse blown memory register formed in the redrive chip. Eighteen of the bits make up the ECID and the remaining six bits are the ECC check bits.

Figure 4:
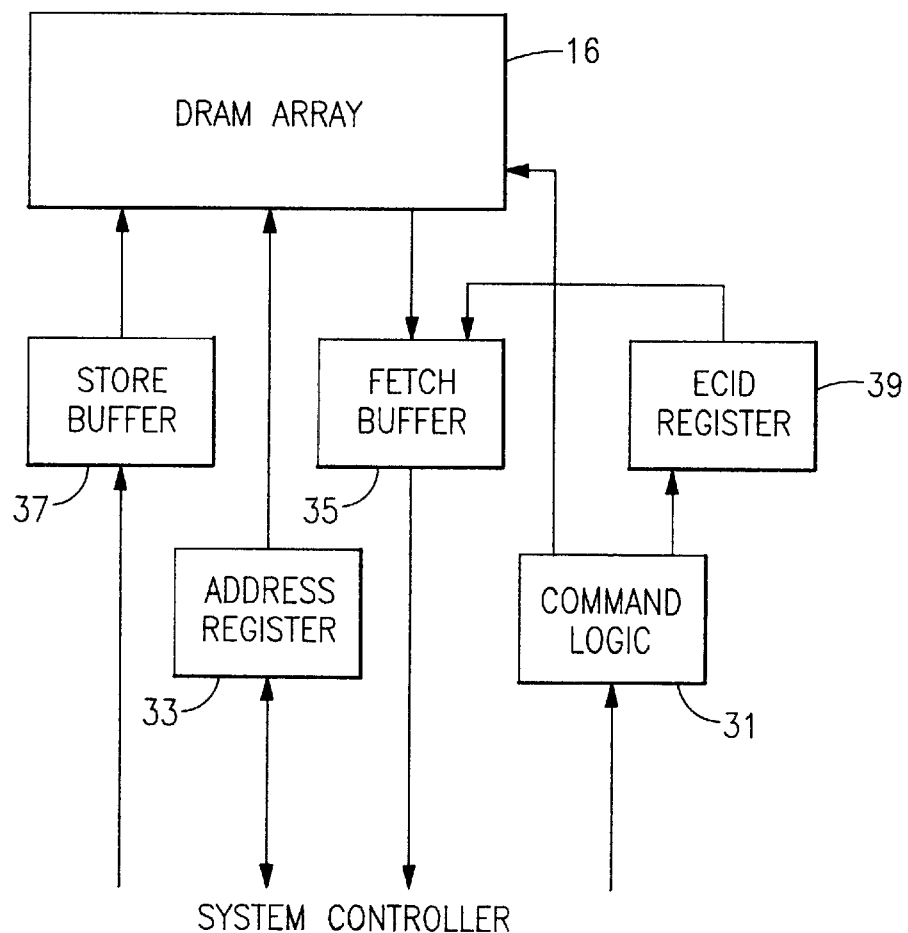
FIG. 4 is a block diagram illustrating the system of a redrive chip in accordance with the invention.

The block diagram in FIG. 4 illustrates the logic or a redrive chip for performing the function of storing data in the DRAMs of the memory card, reading out data from the DRAMs in the memory card or reading out the ECIDs stored in the fuse blown register formed in the redrive chips. As shown in FIG. 4, command logic 31 receives and detects fetch and store commands from the system controller 15 and, in addition, receives and detects ECID fetch commands. The system controller also applies address signals to an address register 33 to select address locations in the DRAMS. When a fetch command is received by the command logic 31, it will read out the data in the DRAM array 16 from the address location selected by the address in the address register 33 to a fetch buffer 35. The data in the fetch buffer is applied to the system controller 15 which transmits the data to the CPU 11. When data is to be stored in the DRAM array 16, the system controller 15 stores the data in a store buffer 35. When the command logic 31 receives a store command, the command logic 31 will apply signals to the DRAM array 16 to store the data in the store buffer 37 in the DRAM array at the address location selected by the address in the address register 33. When the command logic 31 receives the ECID fetch command, the command logic 31 will read out the 24 bit binary number in the ECID fuse blown register 39 to the fetch buffer 35. The fetch buffer is designed to receive 72 bit double words from the DRAM array 16 and the 24 bits received from the ECID register 39 will be stored in bit locations 40–63 in the fetch buffer 35. The system controller 15 will receive the ECID and the associated ECC bits from the fetch buffers of each redrive chip and, in this manner, obtain an identification of the PMA card.

The system controller 15 will decode the 24 received bits of the ECID obtained from each re-drive chip. If the decoding indicates a correctable error, then the system controller 15 will correct the error to provide a correct ECID from each redrive chip. If the decoding indicates that one of the ECIDs contains an uncorrectable error, then only the correct ECID will be used to identify the memory card. While the two ECIDs received from the redrive chips from the memory card will be different, each ECID will provide a unique identification of the memory card and both ECIDs, if valid, are used to independently provide a unique identification of the memory card. Thus, when memory card quality information is logged, the memory card information is logged with both ECIDs for the memory card unless one of the ECIDs contains an uncorrectable error, in which case only the valid one of the ECIDs will be used. When a memory quality event occurs, like the detection of a correctable error or an uncorrectable error in the double word readout from the DRAM, or one of the DRAMs on the memory card is logically replaced with a spare DRAM, the occurrence of this event is logged by the system controller 15 in the service system logging area of the computer memory with both or just one of the ECIDs attached. If both ECIDs are valid, then both ECIDs will be attached to the logged memory event and if only one ECID is valid, then only the valid ECID will be attached. This logged-in information can be fed to a remote service center, put in a data base, and saved for future use with quality control systems.

When a card is sent back from the field to the manufacturing site, each ECID on the chip can be read out again and matched with the chip ECID in the data base. Just one valid ECID stored with the data will be sufficient to access the quality control data base for the memory card. The redundancy provided by having two ECIDs per memory card and by having each ECID encoded with the ECC to correct against fuse failures guarantees traceability for use in quality control systems.

In the above-described system, if either ECID has an uncorrectable error, then only the valid ECID will be used to identify the memory card. If neither of the ECIDs contains an uncorrectable error but one or both of the ECIDs contains a correctable error, the error will be corrected in accordance with the ECC bits and both of the ECIDs will be considered valid identifications of the memory card. Both ECIDs will then be used to provide an identification of the memory card as described above. Alternatively, if one ECID contains a correctable error and the other ECID contains no errors, only the ECID containing no errors may be used as the unique identifier of the memory card.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system for electronically identifying an electronic card, comprising:
   at least one electronic card;
   a first ECID stored in a first read only memory, said read only memory being located in a first redrive chip associated with said electronic card;
   a second ECID stored in a second read only memory, said second read only memory being located in a second redrive chip associated with said electronic card; and
   command logic for reading said first and second ECID out of said first and second redrive chips, said first and second ECIDs being accessible by a system controller associated with said electronic card to identify said electronic card.

2. The system of claim 1 wherein said electronic card comprises a memory card, said memory card including an array of memory chips.

3. The system of claim 1 wherein said first and second ECID comprise error correcting coded bits.

4. The system of claim 3 wherein said first and second ECID each further comprise 24 bits including 18 bits of data and 6 error correction bits.

5. The system of claim 1 wherein said first and second read only memories comprise an array of fuses which are selectively blown to store binary data.

6. The system of claim 1 wherein one of said first and second ECID is associated with a memory quality event.

7. The system of claim 6 wherein one of said first and second ECID and said associated memory quality event are stored in a log of memory quality events.

8. A method for electronically identifying an electronic card, comprising receiving an ECID fetch command;

fetching a first ECID from a first read only memory, said first read only memory being located in a first redrive chip;

writing said first ECID to a first fetch buffer;

fetching a second ECID from a second read only memory, said second read only memory being located in a second redrive chip;

writing said second ECID to a second fetch buffer;

relieving said first and second ECIDs from said first and second fetch buffers;

correcting correctable errors in said first and second ECIDs;

validating one of said first and second ECID, said ECID being validated where said ECID contains either no errors or only correctable errors; and using said validated one of said first and second ECIDs to identify said electronic card.

9. The method of claim 8 wherein said electronic card comprises a memory card, said memory card including an array of memory chips.

10. The method of claim 8 wherein said first and second ECID comprise error correcting coded bits.

11. The method of claim 10 wherein said first and second ECID each further comprise 24 bits including 18 bits of data and 6 error correction bits.

12. The system of claim 8 wherein said first and second read only memories comprise a first and second array of fuses which are selectively blown to store binary data.

13. The system of claim 8 wherein one of said first and second ECID is associated with a memory quality event.

14. The system of claim 8 wherein one of said first and second ECID and said associated memory quality event are stored in a log of memory quality events.

* * * * *

UNITED STATES PATENT AND TRADEMARK OFFICE
CERTIFICATE OF CORRECTION

PATENT NO. : 6,386,456 B1
DATED : May 14, 2002
INVENTOR(S) : Chen et al.

It is certified that error appears in the above-identified patent and that said Letters Patent is hereby corrected as shown below:

<u>Title page,</u>
Item [57], ABSTRACT,
Line 8, after "errors" delete "en" and insert therefor -- in --

<u>Column 3,</u>
Line 51, after "buffer" delete "35" and insert therefor -- 37 --

Signed and Sealed this

Twenty-first Day of June, 2005

JON W. DUDAS
*Director of the United States Patent and Trademark Office*